United States Patent
Song

(10) Patent No.: US 9,257,957 B2
(45) Date of Patent: Feb. 9, 2016

(54) IMPEDANCE MATCHING SYSTEM AND OPERATING METHOD THEREOF

(75) Inventor: Ju Young Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 398 days.

(21) Appl. No.: 13/184,023

(22) Filed: Jul. 15, 2011

(65) Prior Publication Data

US 2012/0016611 A1    Jan. 19, 2012

(30) Foreign Application Priority Data

Jul. 15, 2010  (KR) ......................... 10-2010-0068498

(51) Int. Cl.
 *G01R 27/26*    (2006.01)
 *H03H 7/38*    (2006.01)

(52) U.S. Cl.
 CPC ..................................... *H03H 7/38* (2013.01)

(58) Field of Classification Search
 CPC ....................................................... H03H 7/38
 USPC ............................................................ 702/65
 See application file for complete search history.

(56) References Cited

U.S. PATENT DOCUMENTS 6,100,773 A * 8/2000 Nakamichi et al. ............. 333/32
6,677,828 B1   1/2004 Harnett et al.
2005/0124303 A1 * 6/2005 Bengtson et al. ............... 455/91
2005/0130699 A1 * 6/2005 Kim ........................... 455/550.1
2008/0083969 A1 * 4/2008 Osada ........................... 257/595
2008/0106349 A1   5/2008 McKinzie
2010/0073103 A1 * 3/2010 Spears et al. ................. 333/17.3

FOREIGN PATENT DOCUMENTS

CN          1340913 A        3/2002

OTHER PUBLICATIONS

Office Action dated Apr. 15, 2015 in Chinese Application No. 201110204632.6.

* cited by examiner

*Primary Examiner* — Michael Nghiem
*Assistant Examiner* — Peter Ngo
(74) *Attorney, Agent, or Firm* — Saliwanchik, Lloyd & Eisenschenk

(57) ABSTRACT

An impedance matching system is provided. The impedance matching system includes an impedance matching apparatus and an impedance analysis apparatus. The impedance matching apparatus varies a capacitance value of a capacitor according to an applied voltage value, and matches an impedance according to the varied capacitance value. The impedance analysis apparatus supplies a voltage for varying the capacitance value to an impedance matching circuit, and determines an impedance value, changed according to the voltage value, to analyze characteristic of a capacitor included in the impedance matching apparatus.

16 Claims, 3 Drawing Sheets

IMPEDANCE MATCHING SYSTEM AND OPERATING METHOD THEREOF

CROSS-REFERENCE TO RELATED APPLICATION

This application claims the benefit under 35 U.S.C. §119 of Korean Patent Application No. 10-2010-0068498, filed Jul. 15, 2010, which is hereby incorporated by reference in its entirety.

BACKGROUND

The present disclosure relates to an impedance matching system and an operating method thereof.

In mobile communication terminals, an antenna circuit transmits or receives a certain radio wave signal through an antenna.

Impedance is required to be accurately matched such that the antenna has optimal transmission/reception irradiation performance.

Therefore, the antenna circuit includes a capacitor and an inductor. The antenna circuit controls the value of the capacitor and the value of the inductor to match the impedance of the antenna in an optimal state.

In the matching of impedance, the impedance of an antenna is matched in a state where a mobile communication terminal is located in a free space.

Generally, a user uses a mobile communication terminal in a state where the user holds a body with its hand and brings a speaker into contact with its ear, or uses the mobile communication terminal by using an earphone in a state where the body of the communication terminal has been placed in a bag or a pocket.

Since a user uses a mobile communication terminal in a state where the user has held a body with its hand and brought a speaker into contact with its ear or uses the mobile communication terminal in a state where the body of the communication terminal has been placed in a bag or a pocket, the impedance matching condition of an antenna varies, and consequently, the transmission/reception irradiation performance of the antenna with impedance matched in a free space is degraded.

Accordingly, mobile communication terminals include an adaptive tuning antenna circuit that allows an antenna to have optimal transmission/reception radiation performance by automatically controlling the impedance of the antenna when the impedance matching condition of the antenna is changed.

To optimally maintain the transmission/reception radiation performance of the antenna, the adaptive tuning antenna circuit is required to detect the changed impedance state of the antenna and change a value of a capacitor according to the changed impedance state.

However, since the related art cannot detect the characteristic of the capacitor that is changed according to the changed impedance state, the related art is required to detect a value of a capacitor for optimally maintaining the transmission/reception radiation performance of the antenna, and consequently, a time taken in matching an impedance is increased.

BRIEF SUMMARY

Embodiments provide an impedance matching system and an operating method thereof, which detect and store the characteristic of a variable capacitor included in an antenna circuit, and match an impedance according to the stored characteristic of the variable capacitor.

The object of the present invention is not limited to the aforesaid, but other objects not described herein will be clearly understood by those skilled in the art from descriptions below.

In one embodiment, an impedance matching system includes: an impedance matching apparatus varying a capacitance value of a capacitor according to an applied voltage value, and matching an impedance according to the varied capacitance value; and an impedance analysis apparatus supplying a voltage for varying the capacitance value to an impedance matching circuit, and determining an impedance value, changed according to the voltage value, to analyze characteristic of a capacitor included in the impedance matching apparatus.

In another embodiment, an impedance analysis method includes: outputting a voltage value to be applied to at least one variable capacitor; detecting an impedance value which is changed according to the output voltage value; and storing the detected impedance value in correspondence with the output voltage value to generate a lookup table for analyzing variable characteristic of the variable capacitor.

The details of one or more embodiments are set forth in the accompanying drawings and the description below. Other features will be apparent from the description and drawings, and from the claims.

DETAILED DESCRIPTION

Figure 1:
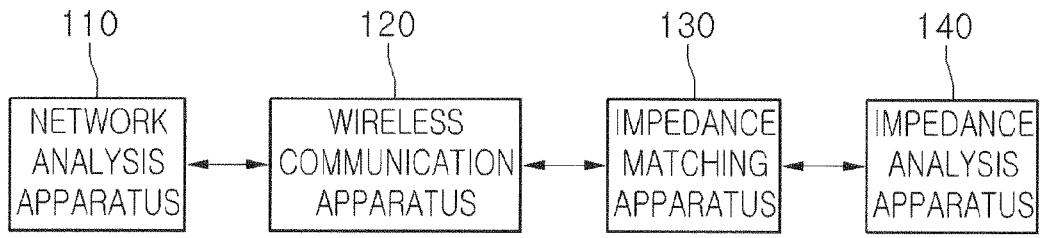
FIG. 1 is a block diagram schematically illustrating an impedance matching system according to an embodiment.

Since the present disclosure may have diverse modified embodiments, specific embodiments are illustrated in the drawings and are described in detail.

However, this does not limit the present invention within specific embodiments and it should be understood that the present invention covers all the modifications, equivalents, and replacements within the idea and technical scope of the present invention.

It will be understood that although the terms of first and second are used herein to describe various elements, these elements should not be limited by these terms. Terms are only used to distinguish one component from other components. Therefore, a component referred to as a first component in one embodiment can be referred to as a second component in another embodiment. The word 'and/or' means that one or more or a combination of relevant constituent elements is possible.

Embodiments of the present invention will be described below in more detail with reference to the accompanying drawings. For convenience of description and clarity, like reference numerals denote like elements throughout.

FIG. 1 is a block diagram schematically illustrating an impedance matching system according to an embodiment.

Figure 2:
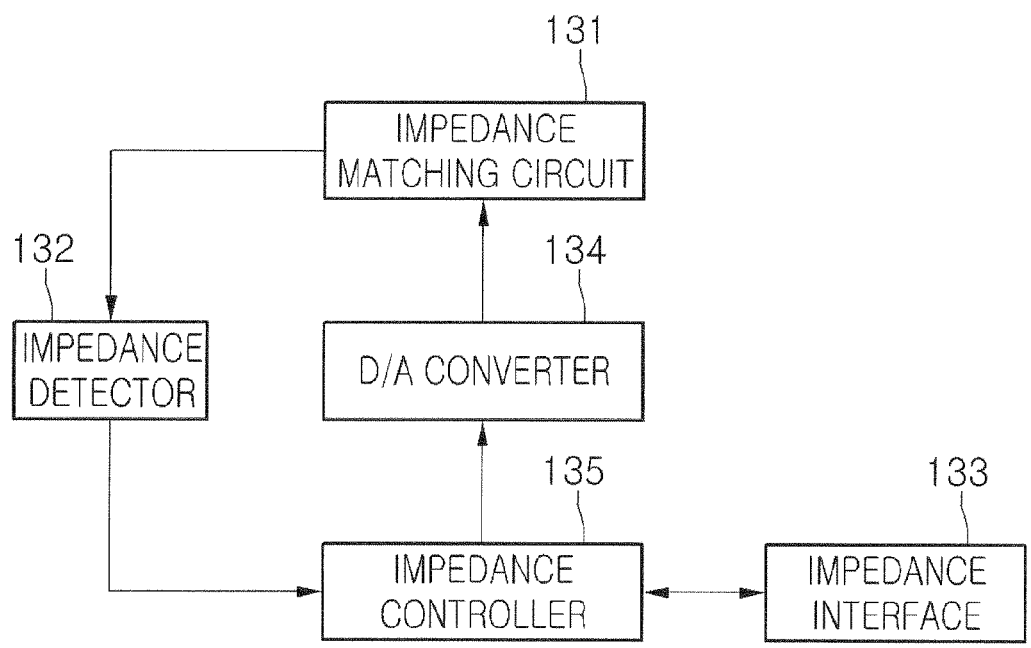
FIG. 2 is a detailed block diagram illustrating an impedance matching apparatus of FIG. 1.

FIG. 2 is a detailed block diagram illustrating an impedance matching apparatus of FIG. 1.

Figure 3:
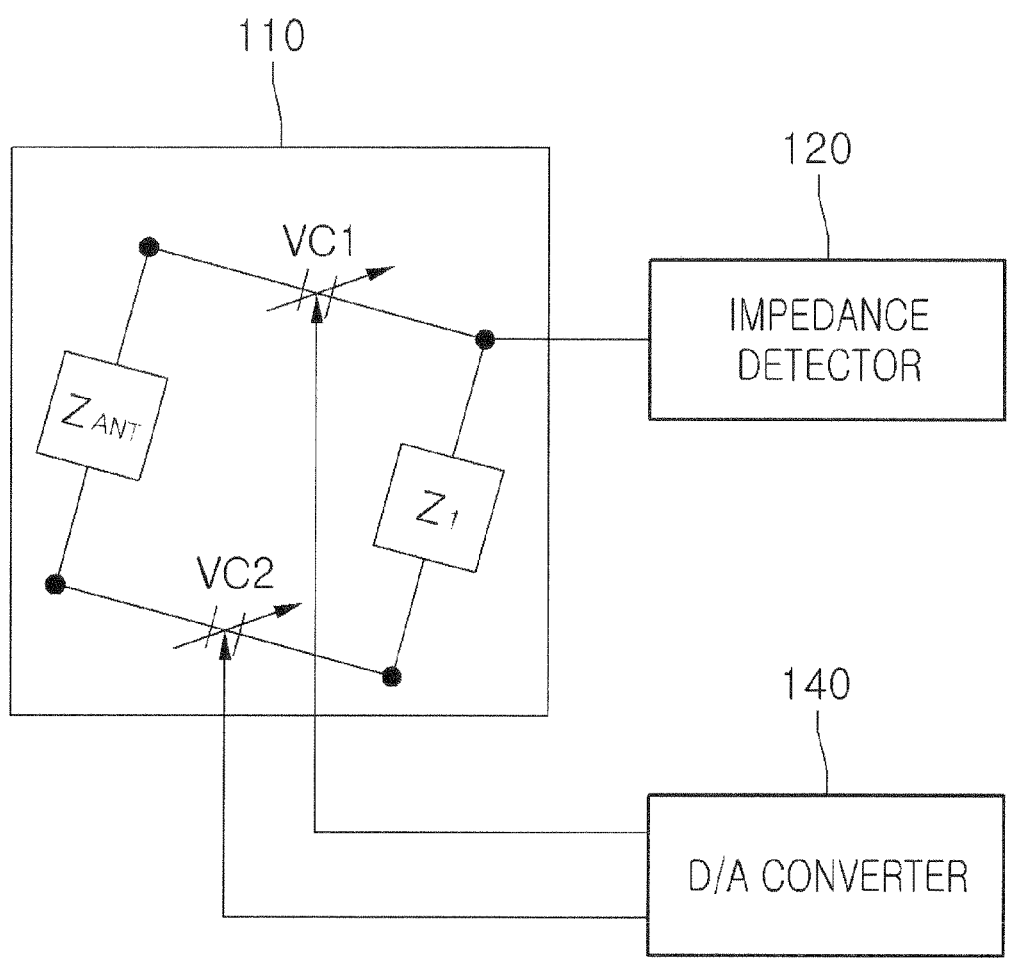
FIG. 3 is a detailed block diagram illustrating an impedance matching circuit of FIG. 2.

FIG. 3 is a detailed block diagram illustrating an impedance matching circuit of FIG. 2.

Referring to FIGS. 1 to 3, an impedance matching system 100 according to a first embodiment includes a network analysis apparatus 110, a wireless communication apparatus 120, an impedance matching apparatus 130, and an impedance analysis apparatus 140.

The network analysis apparatus 110 gene rates a specific frequency, and outputs the specific frequency to at least one wireless communication apparatus connected thereto.

The wireless communication apparatus 120 wirelessly communicates with the network analysis apparatus 110 to receive the specific frequency outputted from the network analysis apparatus 110.

Herein, the wireless communication apparatus 120 may be implemented as a mobile communication terminal.

The wireless communication apparatus 120 may be provided to support at least one standard transmission technology of Code-Division Multiple Access (CDMA), Wideband Code Division Multiple Access (WCDMA), and Global System for Mobile Communications (GSM).

The impedance matching apparatus 130 is connected to the wireless communication apparatus 120, and detects an impedance value that corresponds to the specification of the wireless communication apparatus 120 and the specific frequency supplied to the wireless communication apparatus 120.

The impedance matching apparatus 130 includes at least one variable capacitor, and may change a capacitance value applied to the variable capacitor to vary the detected impedance value.

Particularly, the impedance matching apparatus 130 is provided for impedance matching, and the impedance matching may be performed by varying the capacitance value applied to the variable capacitor.

Moreover, the impedance matching apparatus 130 is connected to the impedance analysis apparatus 140, receives a voltage value supplied from the impedance analysis apparatus 140, and changes a capacitance value of the variable capacitor according to the received voltage value.

When the capacitance value is changed, the impedance matching apparatus 130 detects an impedance value that varies according to the changed capacitance value, and transmits the detected impedance value to the impedance analysis apparatus 140.

In other words, the impedance matching apparatus 130 is provided for impedance matching, changes the capacitance value of the variable capacitor according to a voltage value transmitted from the impedance analysis apparatus 140, detects an impedance value that is changed according to the changed capacitance value, and transmits the detected impedance value to the impedance analysis apparatus 140.

The impedance analysis apparatus 140 generates a lookup table (LUT) for analyzing the characteristic of the variable capacitor included in the impedance matching apparatus 130.

For this, the impedance analysis apparatus 140 determines a voltage value that will be applied to the variable capacitor included in the impedance matching apparatus 130, and transmits the determined voltage value to the impedance matching apparatus 130.

The impedance analysis apparatus 140 receives an impedance value, changed according to the transmitted voltage value, through the impedance matching apparatus 130, stores the received impedance value in correspondence with the transmitted voltage value, and generates a lookup table, including an impedance value that is changed according to the voltage value, for analyzing the variable characteristic of a variable capacitor The impedance analysis apparatus 140 continuously changes a voltage value, applied to the variable capacitor, within an entire variable range of the variable capacitor, and generates the lookup table by using an impedance value that is detected in correspondence with the continuously changed voltage value.

The impedance analysis apparatus 140 generates the lookup table according to the specification of the wireless communication apparatus 120 connected to the impedance matching apparatus 130.

For example, when the connected wireless communication apparatus 120 has an A specification, a lookup table generated by the impedance analysis apparatus 140 shows the variable characteristic of the variable capacitor of the impedance matching apparatus 130 corresponding to the wireless communication apparatus 120 having the A specification.

The impedance analysis apparatus 140 generates the lookup table according to a frequency that is currently supplied to the wireless communication apparatus 120.

That is, the impedance analysis apparatus 140 generates the lookup table corresponding to an A frequency, and generates the lookup table as a lookup table corresponding to the A frequency.

Therefore, the lookup table is divided into first to Nth lookup tables according to the specification of the wireless communication apparatus 120, the Nth lookup table includes variable characteristic information of variable capacitors respectively corresponding to first to Nth frequencies.

To provide a more detailed description on the impedance matching apparatus 130, the impedance matching apparatus 130 includes an impedance matching circuit 131, an impedance detector 132, an impedance interface 133, a digital-to-analog (D/A) converter 134, and an impedance controller 135.

The impedance matching circuit 131 may be electrically connected to the wireless communication apparatus 120, and provided for matching an impedance value between antenna impedances Z1 and ZANT corresponding to a specific frequency from the wireless communication apparatus 120.

The impedance detector 132 is electrically connected to the impedance matching circuit 131, and detects an impedance value between the current antenna impedances Z1 and ZANT corresponding to a specific frequency from the impedance matching circuit 131.

The impedance interface 133 is electrically connected to the impedance detector 132, transmits a impedance value between the current antenna impedances Z1 and ZANT detected by the impedance detector 132, and receives a voltage value, transmitted from the impedance analysis apparatus 140, which will be applied to at least one variable capacitors VC1 and VC2.

The antenna impedance interface 133 may include at least one of Universal Serial Bus (USB) and Universal Asynchronous Receiver Transmitter (UART).

The D/A converter 134 is electrically connected to the impedance interface 133 to covert a voltage value, which is supplied from the impedance interface 133 and will be applied to the impedance matching circuit 131, into an analog signal.

The impedance controller 135 is electrically connected to the D/A converter 134 to deliver the voltage value to the D/A converter 134, and by controlling a voltage applied between the current antenna impedances Z1 and ZANT according to the delivered voltage value with the at least one variable capacitors VC1 and VC2 included in the impedance matching circuit 131, the impedance controller 135 may control the current antenna impedances Z1 and ZANT so as to be matched with each other.

When the impedance is controlled according tot the voltage value, the impedance controller 135 detects the controlled impedance value, and performs control such that the detected impedance value is transmitted to the impedance analysis apparatus 140 through the impedance interface 133.

Herein, the impedance controller 135 may include a Micro Controller Unit (MCU).

The at least one variable capacitors VC1 and VC2 is electrically connected between the antenna impedances Z1 and ZANT, and may include the first variable capacitor VC1 and the second variable capacitor VC2 that are connected in parallel.

Therefore, the impedance analysis apparatus 140 determines first and second voltage values to be applied to the first and second variable capacitors, and transmits the determined first and second voltage values to the impedance interface 133.

Figure 4:
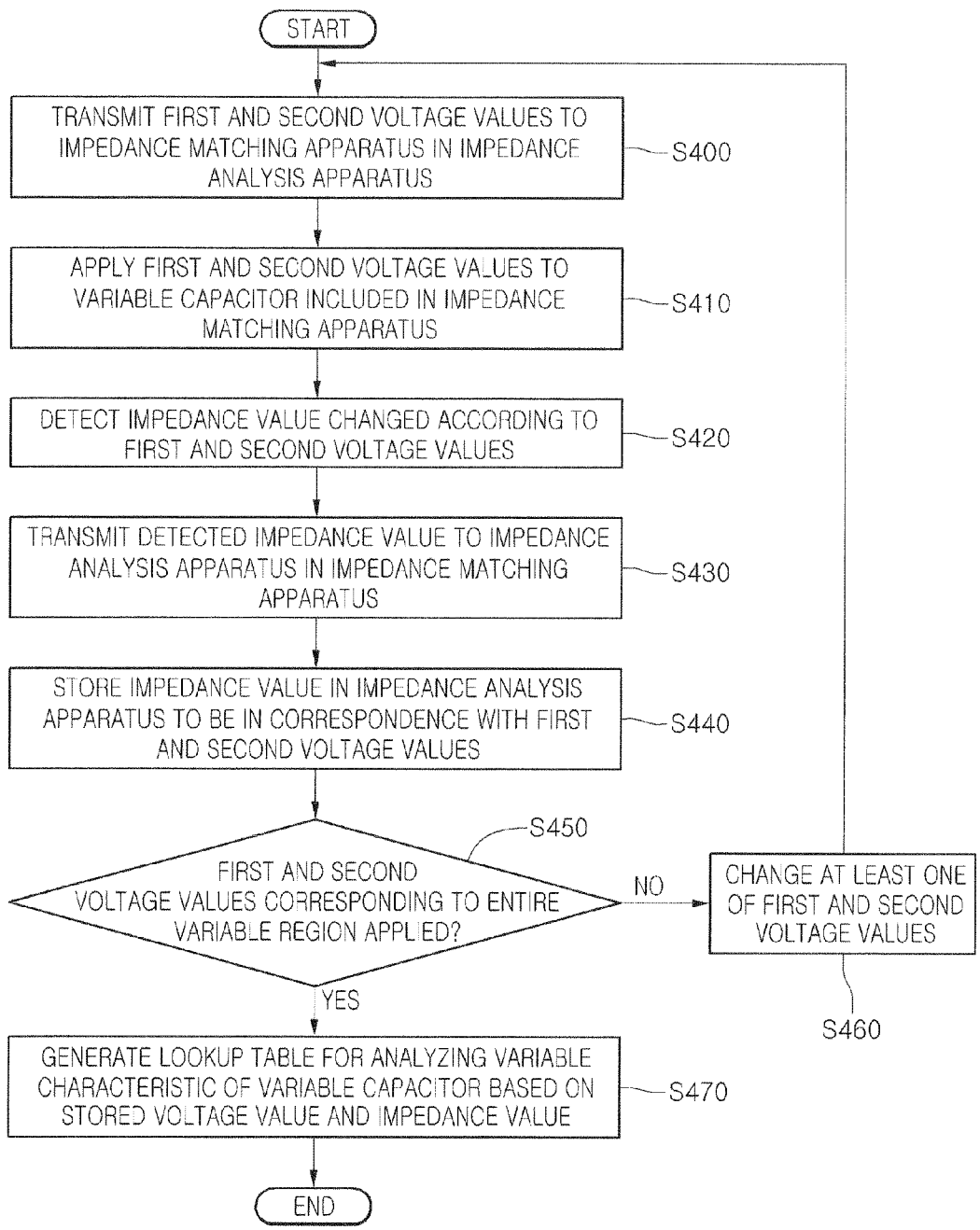
FIG. 4 is a flowchart illustrating an operating method of an impedance matching system according to an embodiment.

FIG. 4 is a flowchart illustrating an operating method of an impedance matching system according to an embodiment.

Referring to FIG. 4, in operation S400, the impedance analysis apparatus 140 determines a voltage value that will be applied to at least one variable capacitor included in the impedance matching apparatus 130, and transmits the determined voltage value to the impedance matching apparatus 130.

Herein, the voltage value may include a first voltage value to be applied to the first variable capacitor VC1, and a second voltage to be applied to the second variable capacitor VC2. Also, first and second voltage values that are initially outputted may be any one value that lies within a variable range of the variable capacitor.

In operation S410, when first and second voltage values are transmitted through the impedance analysis apparatus 140, the impedance matching apparatus 130 changes a capacitance value of a variable capacitor by applying the first and second voltage values.

In operation S420, when the capacitance value of the variable capacitor is changed by applying the first and second voltage values, the impedance matching apparatus 130 detects an impedance value that is changed according to the changed capacitance value.

In operation S430, the impedance matching apparatus 130 transmits the impedance value, which is changed by applying the first and second voltage values transmitted from the impedance analysis apparatus 140, to the impedance analysis apparatus 140.

In operation S440, the impedance analysis apparatus 140 stores the impedance value transmitted from the impedance matching apparatus 130 so as to be in correspondence with the first and second voltage values transmitted to the impedance matching apparatus 130.

In operation S450, the impedance analysis apparatus 140 checks whether or not first and second voltage values within an entire variable range of the variable capacitor have been transmitted to the impedance matching apparatus 130.

In other words, the impedance analysis apparatus 140 determines whether or not an impedance value, corresponding to the first and second voltage values within the entire variable range of the variable capacitor, has been checked.

When the checked result of operation S450 shows that the first and second voltage values within the entire variable range of the variable capacitor have not been transmitted to the impedance matching apparatus 130, the impedance analysis apparatus 140 changes at least one of previously transmitted first and second voltage values in operation S460.

When the first and second voltage values are changed, the operating method returns to operation S400, and successively performs an operation of detecting an impedance value corresponding to the changed first and second voltage values.

When the checked result of operation S450 shows that the first and second voltage values within the entire variable range of the variable capacitor have been transmitted to the impedance matching apparatus 130, the impedance analysis apparatus 140 generates a lookup table for analyzing the variable characteristic of the variable capacitor by using the stored first and second voltage values within the entire variable range and an impedance value corresponding to the stored first and second voltage values in operation S470.

Herein, the lookup table is classified and generated according to the specification of the wireless communication apparatus 120 connected to the impedance matching apparatus 130 and a frequency outputted from the network analysis apparatus 110.

As described above, before releasing the wireless communication apparatus 130, the impedance matching system 100 analyzes the variable characteristic of a variable capacitor that matches the antenna impedance of the wireless communication apparatus 120, based on specification, and thus, the impedance matching system 100 can perform impedance matching for a short time, thereby decreasing the distortion rate of a transmitted/received signal.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An impedance matching system comprising:
    an impedance matching apparatus comprising an impedance matching circuit that comprises at least two variable capacitors connected between a first impedance (Z1) and an antenna impedance (ZANT), the at least two variable capacitors comprising a first variable capacitor and a second variable capacitor that are connected in parallel, wherein the impedance matching apparatus is configured to vary capacitance values of the at least two variable capacitors according to an input voltage, and match impedances according to the varied capacitance value; and
    an impedance analysis apparatus configured to supply the input voltage to the impedance matching apparatus for varying the capacitance values, determine an output impedance value from the impedance matching apparatus wherein the output impedance value is changed in response to the input voltage to analyze characteristics of the at least two variable capacitors of the impedance matching apparatus, store a value of the input voltage into a first entry of a lookup table, and store value of the output impedance into a second entry of the lookup table, wherein the second entry corresponds to the first entry of the lookup table;
    wherein the impedance analysis apparatus is configured to continuously change the input voltage applied to the at least two variable capacitors within an entire variable range of the at least two variable capacitors and generate the lookup table by storing values of the continuously changed input voltage and values of the output impedance into corresponding entries of the lookup table wherein the values of the output impedance are detected to be changed in response to the continuously changed input voltage, wherein a first end of a first variable capacitor of the at least two variable capacitors is directly connected to a first end of the antenna impedance (ZANT) and a second end of the first variable capacitor is directly connected to a first end of the first impedance (Z1), wherein a first end of a second variable capacitor of the at least two variable capacitors is directly connected to a second end of the antenna impedance (ZANT) and a second end of the second variable capacitor is directly connected to a second end of the first impedance (Z1), wherein the impedance matching apparatus comprises an impedance detector detecting an impedance value which is changed according to a capacitance value supplied to the impedance matching circuit, and wherein the impedance detector is connected to a junction of the second end of the first variable capacitor and the first end of the first impedance (Z1).

2. The impedance matching system according to claim 1, wherein the impedance matching apparatus varies the capacitance value according to the voltage value supplied through the impedance analysis apparatus, and detects an impedance value, changed according to the varied capacitance value, to supply the detected impedance value to the impedance analysis apparatus.

3. The impedance matching system according to claim 1, the impedance matching apparatus further comprising:
   an impedance interface receiving a voltage value supplied through the impedance analysis apparatus, and transmitting an impedance value, corresponding to the received voltage value, to the impedance analysis apparatus;
   a digital-to-analog (D/A) converter converting a voltage value, received through the impedance interface, to an analog signal; and
   an impedance controller varying capacitance values of the at least two variable capacitors according to the received voltage value, and detecting an impedance value, changed according to the capacitance value, to supply the detected impedance value to the impedance analysis apparatus.

4. The impedance matching system according to claim 3, wherein the impedance interface comprises at least one of Universal Serial Bus (USB) and Universal Asynchronous Receiver Transmitter (UART).

5. The impedance matching system according to claim 3, wherein
   the lookup table is classified and generated according to specification of the wireless communication apparatus connected to the impedance matching apparatus,
   the impedance analysis apparatus classifies the wireless communication apparatus, based on specification of the wireless communication apparatus connected to the impedance matching apparatus, to analyze the characteristics of the first and the second variable capacitors.

6. The impedance matching system according to claim 3, further comprising a network analysis apparatus generating a specific frequency, and wirelessly communicating with the wireless communication apparatus to output the specific frequency to the wireless communication apparatus,
   wherein the lookup table is classified and generated according to a frequency outputted to the impedance matching apparatus.

7. The impedance matching system according to claim 3, wherein the wireless communication apparatus supports at least one standard transmission technology of Code-Division Multiple Access (CDMA), Wideband Code Division Multiple Access (WCDMA), and Global System for Mobile Communications (GSM).

8. The impedance matching system according to claim 3, wherein the wireless communication apparatus comprises a mobile communication terminal.

9. The impedance matching system according to claim 1, wherein the impedance analysis apparatus transmits first and second voltage values, which will be respectively applied to the first and second variable capacitors, to the impedance matching apparatus and receives an impedance value, changed according to the transmitted first and second voltage values, to analyze characteristics of the first and second variable capacitors.

10. The impedance matching system according to claim 9, wherein the impedance analysis apparatus varies the first and second voltage values applied to the first and second variable capacitors at intervals, and stores an impedance value corresponding to the varied first and second voltage values to generate the lookup table according to characteristics of the first and second variable capacitors.

11. The impedance matching system according to claim 1, wherein the impedance analysis apparatus comprises a database management apparatus, the database management apparatus comprising a personal computer.

12. An impedance analysis method comprising:
   applying an input voltage to an impedance matching circuit comprising at least two variable capacitors connected between a first impedance (Z1) and an antenna impedance (ZANT), the at least two variable capacitors comprising a first variable capacitor and a second variable capacitor that are connected in parallel;
   detecting by an impedance detector, a value of an output impedance which is changed according to a value of the input voltage; and
   storing the detected output impedance value and the input voltage value into corresponding entries of a lookup table for analyzing variable characteristics of the at least two variable capacitors,
   wherein the lookup table is generated by continuously changing values of the input voltage applied to the at least two variable capacitors within an entire variable range of the at least two variable capacitors and by storing both values of the continuously changed input voltage and values of the output impedance that are detected to be changed in response to the values of the continuously changed input voltage,
   wherein a first end of the first variable capacitor is directly connected to a first end of the antenna impedance (ZANT) and a second end of the first variable capacitor is direct connected to a first end of the first impedance (Z1),
   wherein a first end of the second variable capacitor is directly connected to a second end of the antenna impedance (ZANT) and a second end or the second variable capacitor is directly connected to a second end of the first impedance (Z1), and
   wherein the impedance detector is connected to a junction of the second end of the first variable capacitor and the first end of the first impedance (Z1).

13. The impedance analysis method of claim 12, wherein the outputting of a voltage value comprises outputting first and second voltage values to be respectively applied to the first and second variable capacitors.

14. The impedance analysis method of claim 13, wherein the generating of a lookup table comprises generating a lookup table which comprises an impedance value corresponding to the first and second voltage values.

15. The impedance analysis method of claim 12, wherein,
the impedance value is changed according to specification of the wireless communication apparatus, and
the lookup table is classified and generated according to the specification of the wireless communication apparatus.

16. The impedance analysis method of claim 12, wherein,
the impedance value is changed according to a frequency supplied to the wireless communication apparatus, and
the lookup table is classified and generated according to the frequency supplied to the wireless communication apparatus.

* * * * *